United States Patent
Staszewski et al.

(10) Patent No.: US 8,564,348 B1
(45) Date of Patent: Oct. 22, 2013

(54) CLOCK GENERATOR FOR GENERATING OUTPUT CLOCK HAVING NON-HARMONIC RELATIONSHIP WITH INPUT CLOCK AND RELATED CLOCK GENERATING METHOD THEREOF

(71) Applicant: Mediatek Inc., Hsin-Chu (TW)

(72) Inventors: Robert Bogdan Staszewski, Delft (NL); Chi-Hsueh Wang, Kaohsiung (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/925,858

(22) Filed: Jun. 25, 2013

Related U.S. Application Data

(62) Division of application No. 13/170,197, filed on Jun. 28, 2011, now Pat. No. 8,493,107.

(60) Provisional application No. 61/368,015, filed on Jul. 27, 2010.

(51) Int. Cl.
  *H03L 7/06* (2006.01)

(52) U.S. Cl.
  USPC .......................................... 327/158; 327/149

(58) Field of Classification Search
  USPC ................................. 327/149, 158
  See application file for complete search history.

(56) References Cited

U.S. PATENT DOCUMENTS

| | | | |
|---|---|---|---|
| 4,639,780 A * | 1/1987 | Willis | 348/536 |
| 5,172,397 A | 12/1992 | Llewellyn | |
| 5,214,682 A * | 5/1993 | Clark | 377/56 |
| 5,970,110 A | 10/1999 | Li | |
| 6,359,950 B2 | 3/2002 | Gossmann et al. | |
| 6,748,408 B1 | 6/2004 | Bredin et al. | |
| 6,791,379 B1 * | 9/2004 | Wakayama et al. | 327/156 |
| 6,897,691 B2 | 5/2005 | Chen et al. | |
| 7,084,678 B2 | 8/2006 | Van Zeijl | |
| 7,205,804 B2 | 4/2007 | Schoner | |
| 7,356,107 B2 * | 4/2008 | Xiu et al. | 375/355 |
| 7,496,168 B2 * | 2/2009 | Leonowich et al. | 375/376 |
| 7,532,029 B1 | 5/2009 | Asaduzzaman et al. | |
| 7,560,962 B2 * | 7/2009 | Kamath | 327/158 |
| 7,635,999 B1 | 12/2009 | Jamal | |
| 7,636,007 B2 * | 12/2009 | Wakayama et al. | 327/408 |
| 7,741,918 B1 * | 6/2010 | Li | 331/16 |

(Continued)

FOREIGN PATENT DOCUMENTS

CN     1608342 A     4/2005

OTHER PUBLICATIONS

Pellerano, A 4.75-GHz Fractional Frequency Divider-by-1.25 With TDC-Based All-Digital Spur Calibration in 45-nm CMOS, IEEE Journal of Solid-State Circuits, pp. 3422-3433, vol. 44, No. 12, Dec. 2009.

*Primary Examiner* — Adam Houston
(74) *Attorney, Agent, or Firm* — Winston Hsu; Scott Margo

(57) ABSTRACT

A clock generator has an oscillator block and an output block. The oscillator block provides a second clock of multiple phases, and includes an oscillator and a delay locked loop (DLL). The oscillator is used to provide a first clock. The DLL is used to generate the second clock according to the first clock. The output block is used to receive the second clock and generate a third clock by selecting signals from the multiple phases, wherein the third clock has non-harmonic relationship the first clock.

20 Claims, 13 Drawing Sheets

(56) References Cited

U.S. PATENT DOCUMENTS

| | | |
|---|---|---|
| 7,778,610 B2 | 8/2010 | Staszewski et al. |
| 7,809,338 B2 * | 10/2010 | Tsfati ............................. 455/76 |
| 7,894,564 B2 * | 2/2011 | Hsiao-Chyi ................... 375/375 |
| 8,063,677 B2 | 11/2011 | Kim |
| 8,248,118 B2 * | 8/2012 | Subburaj et al. .............. 327/115 |
| 8,493,107 B2 * | 7/2013 | Staszewski et al. ........... 327/141 |
| 2003/0099321 A1 * | 5/2003 | Juan et al. ..................... 375/376 |
| 2003/0118142 A1 * | 6/2003 | Xiu et al. ....................... 375/376 |
| 2004/0196108 A1 * | 10/2004 | Craninckx ....................... 331/16 |
| 2004/0252805 A1 * | 12/2004 | Van Zeijl ......................... 377/48 |
| 2005/0030073 A1 * | 2/2005 | Wakayama et al. ........... 327/156 |
| 2005/0162552 A1 * | 7/2005 | Xiu et al. ....................... 348/521 |
| 2005/0225367 A1 * | 10/2005 | Schoner ......................... 327/158 |
| 2006/0132200 A1 | 6/2006 | Dietl |
| 2006/0245531 A1 * | 11/2006 | Leonowich et al. ........... 375/376 |
| 2006/0284746 A1 * | 12/2006 | Huang et al. ..................... 341/50 |
| 2007/0041484 A1 * | 2/2007 | Khanoyan ...................... 375/376 |
| 2007/0194817 A1 * | 8/2007 | Decker et al. ................. 327/141 |
| 2007/0285176 A1 * | 12/2007 | North ................................ 331/8 |
| 2008/0002788 A1 | 1/2008 | Akhtar |
| 2008/0055010 A1 | 3/2008 | Lerner |
| 2008/0094145 A1 | 4/2008 | Kuan |
| 2008/0107154 A1 * | 5/2008 | Hsiao-Chyi ................... 375/130 |
| 2008/0111634 A1 | 5/2008 | Min |
| 2008/0122501 A1 * | 5/2008 | Narusawa et al. ............. 327/144 |
| 2008/0265998 A1 * | 10/2008 | Wood ................................ 331/2 |
| 2009/0243679 A1 | 10/2009 | Smith |
| 2012/0025918 A1 * | 2/2012 | Wang et al. ..................... 331/25 |
| 2012/0027143 A1 * | 2/2012 | Wang et al. ................... 375/354 |
| 2012/0032715 A1 * | 2/2012 | Subburaj et al. .............. 327/115 |
| 2012/0194235 A1 * | 8/2012 | Subburaj et al. .............. 327/156 |

* cited by examiner

CLOCK GENERATOR FOR GENERATING OUTPUT CLOCK HAVING NON-HARMONIC RELATIONSHIP WITH INPUT CLOCK AND RELATED CLOCK GENERATING METHOD THEREOF

CROSS REFERENCE TO RELATED APPLICATIONS

This is a divisional application of co-pending U.S. application Ser. No. 13/170,197 (filed on Jun. 28, 2011), which claims the benefit of U.S. provisional application No. 61/368,015 (filed on Jul. 27, 2010). The entire contents of the related applications are incorporated herein by reference.

BACKGROUND

The disclosed embodiments of the present invention relate to generating a clock signal, and more particularly, to a clock generator for generating an output clock having non-harmonic relationship with an input clock and related clock generating method thereof.

With the development of the semiconductor technology, more and more functions are allowed to be supported by a single electronic device. For example, a multi-radio combo-chip product may support a plurality of communication protocols. All of the radio-frequency (RF) oscillators should be properly designed to avoid conflicting with each other. Specifically, good isolation is required, and injection pulling among oscillators of different radios should be prevented. For example, the pulling of one LC-tank oscillator due to the strong harmonic of the power amplifier (PA) output should be avoided; besides, the pulling of one LC-tank oscillator due to a local oscillator (LO) signal or PA signal of another integrated radio should be avoided. Thus, it results in a complicated frequency plan and difficult local oscillator design, especially in analog circuits. In a case where the analog approach is employed, it requires conventional analog blocks such as frequency divider(s) and mixer(s) which limit the frequency offset ratio to a rational number, and requires an LC-tank for unwanted side-band spur suppression which inevitably consumes large area and current.

Thus, there is a need for an innovative non-harmonic clock generator design which may employ a digital realization for generating an output clock having non-harmonic relationship with an input clock through frequency translation that utilizes an edge rotator operating on multiple phases of an oscillator, and may also employ an autonomous calibration process to compensate for phase errors by calibrating timing mismatch of the edge rotator.

SUMMARY OF THE INVENTION

In accordance with exemplary embodiments of the present invention, a clock generator for generating an output clock having non-harmonic relationship with an input clock and related clock generating method thereof are proposed.

According to a first aspect of the present invention, an exemplary clock generator is disclosed. The exemplary clock generator includes an oscillator block and an output block. The oscillator block is arranged to provide a second clock of multiple phases. The oscillator block includes oscillator arranged to provide a first clock, and a delay locked loop (DLL) arranged to generate said second clock according to said first clock. The output block is arranged to receive said second clock and generate a third clock by selecting signals from said multiple phases, wherein said third clock has non-harmonic relationship with said first clock.

According to a second aspect of the present invention, an exemplary clock generating method is disclosed. The exemplary clock generating method includes at least the following steps: providing a second clock of multiple phases, comprising: providing a first clock, and utilizing a delay locked loop (DLL) to generate said second clock according to said first clock; and receiving said second clock and generating a third clock by selecting signals from said multiple phases, wherein said third clock has non-harmonic relationship with said first clock.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is electrically connected to another device, that connection may be through a direct electrical connection, or through an indirect electrical connection via other devices and connections.

In accordance with exemplary embodiment of the present invention, the frequency translation used for generating an output clock having non-harmonic relationship with an input clock is realized using an edge synthesizer based on edge selection and delay adjustment. For example, the new edge may be created by certain delay mechanism, such as a delay line or a delay-locked loop. The offset frequency may be programmable by selecting the edge transversal pattern and properly adjusting the delay values. Besides, the phase error/delay mismatch resulted from an incorrect delay value setting or other factor(s) may be detected and calibrated by the proposed autonomous calibration process. The proposed non-harmonic clock generator has a flexible frequency plan for spur avoidance, and is suitable for any frequency ratio needed. Moreover, the proposed non-harmonic clock generator has a simple circuit design due to the fact that an edge synthesizer for selection of various clock phases is employed to replace the analog mixer of the conventional analog approach that requires additional filtering to remove mixing spurious products and consumes large current and circuit area. The proposed non-harmonic clock generator may be employed in a wireless communication application, such as a multi-radio combo-chip product. However, this is not meant to be a limitation of the present invention. Any application using the proposed non-harmonic clock generator for providing an output clock having non-harmonic relationship with an input clock falls within the scope of the present invention. Technical features of the proposed non-harmonic clock generator are detailed as below.

Figure 1:
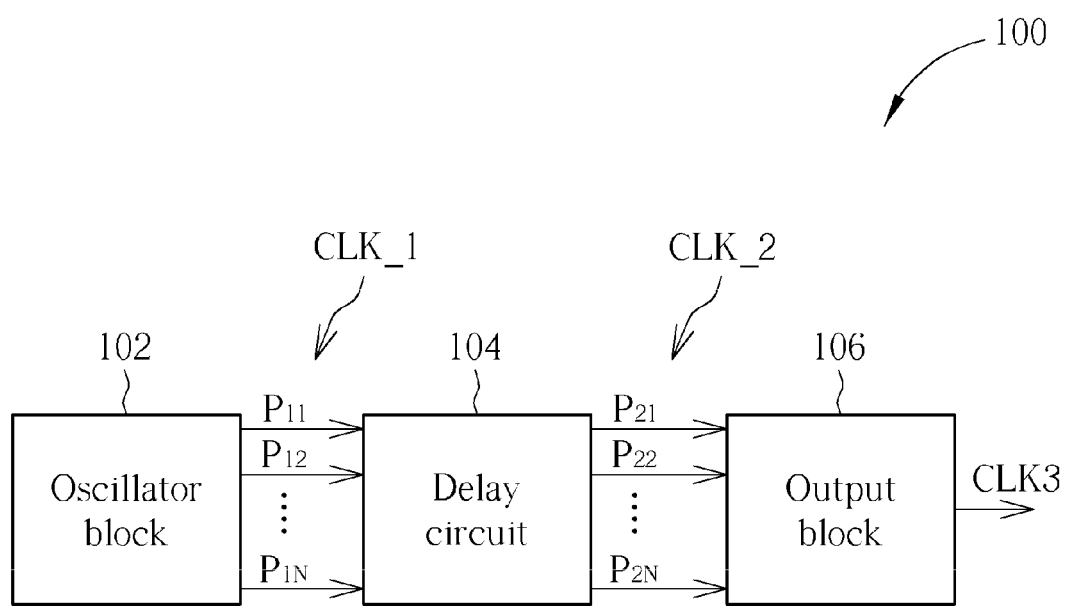
FIG. 1 is a block diagram illustrating a generalized clock generator according to an exemplary embodiment of the present invention.

FIG. 1 is a block diagram illustrating a generalized clock generator according to an exemplary embodiment of the present invention. The clock generator 100 includes an oscillator block 102, a delay circuit 104, and an output block 106. The oscillator block 102 is arranged to provide a first clock CLK1 of multiple phases $P_{11}, P_{12}, \ldots, P_{1N}$. The delay circuit 104 is coupled to the oscillator block 102, and arranged to delay at least one of the multiple phases $P_{11}$-$P_{1N}$ of the first clock CLK1 to generate a second clock CLK2 of multiple phases $P_{21}, P_{22}, \ldots, P_{2N}$. The output block 106 is coupled to the delay circuit 104, and arranged to receive the second clock CLK2 and generate a third clock CLK3 by selecting signals from the multiple phases $P_{21}$-$P_{2N}$ of the second clock CLK2. It should be noted that the third clock CLK3 has non-harmonic relationship with the first clock CLK1. By way of example, but not limitation, the non-harmonic relationship means clock edges of the third clock CLK3 are not statically aligned with that of the first clock CLK1, or the clock frequencies of the third clock CLK3 and the first clock CLK1 have a non-integer ratio. With the delay circuit 104 inserted between the oscillator block 102 and the output block 106 for delaying at least one of the phases provided by the oscillator block 102, desired phases needed by the output block 106 are generated. The oscillator block 102 may be implemented by any available oscillator that is capable of providing a multi-phase clock output. In one exemplary design, the oscillator block 102 may be implemented by an LC-tank oscillator core followed by an edge divider. For example, the oscillator block 102 can comprise an oscillator circuit producing a differential signal followed by a divide-by-two circuit producing a quadrature clock output. Alternatively, the LC-tank oscillator can be followed by one or more delay cells. It needs to be emphasized that, in general, a delay can be achieved either by reclocking a signal (edge division falls into this category) or through propagation delay (delay elements, such as inverters, buffers, delay lines fall into this category). Thus, at least one of the multiple phases of the first clock is generated by clock edge division or by delaying another of the multiple phases of the first clock with a phase offset, where the phase offset is determined by a relationship between a frequency of the first clock CLK1 and a frequency of the third clock CLK3. Further details of the clock generator 100 are described as below.

Figure 2:
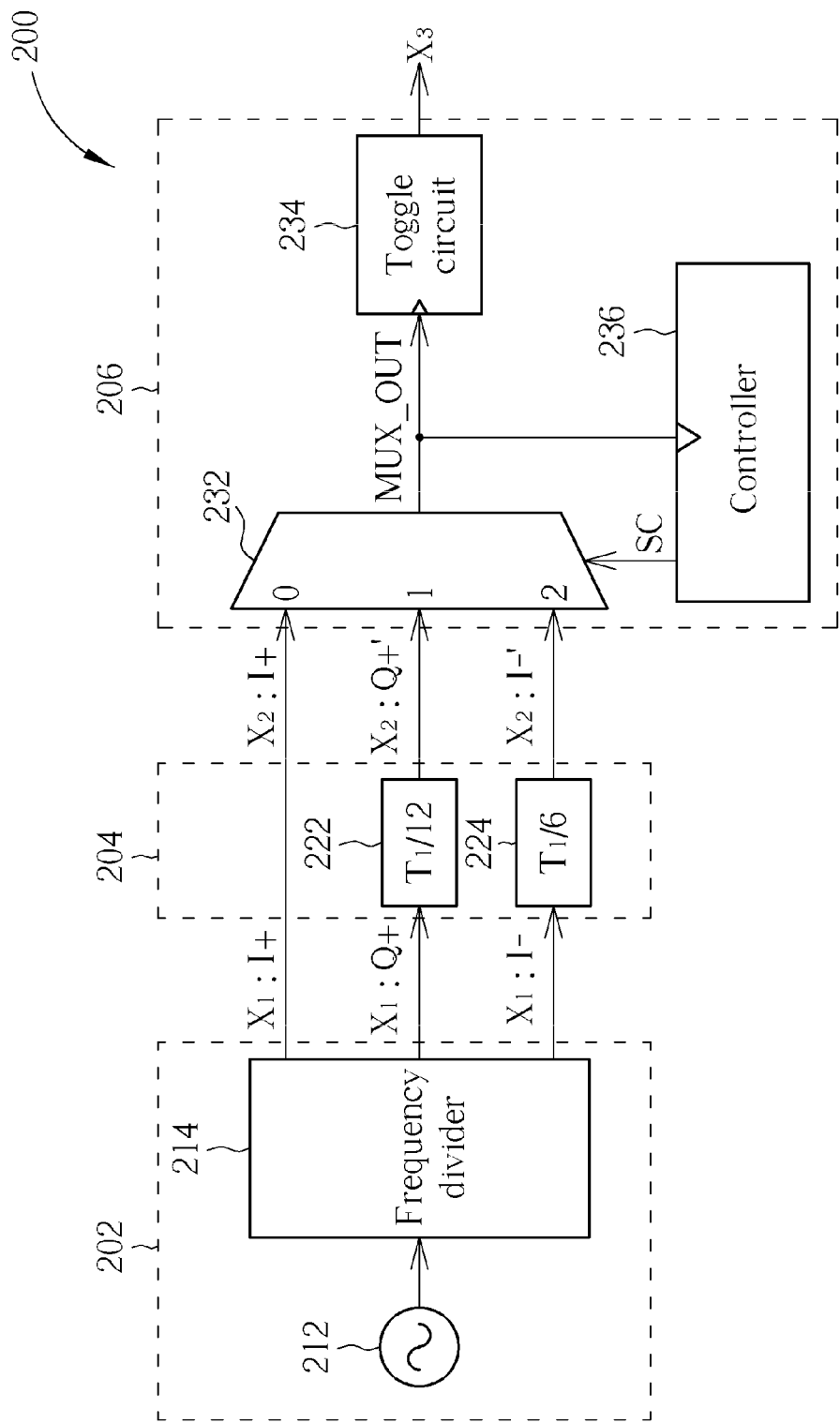
FIG. 2 is a diagram illustrating a clock generator according to a first exemplary embodiment of the present invention.

Please refer to FIG. 2, which is a diagram illustrating a clock generator according to a first exemplary embodiment of the present invention. The implementation of the exemplary clock generator 200 is based on the structure shown in FIG. 1, and therefore has an oscillator block 202, a delay circuit 204, and an output block 206. In this exemplary embodiment, the oscillator block 202 is realized by an oscillator core 212 such as a digitally-controlled oscillator (DCO) with a tuning word input (not shown), and a frequency divider 214 arranged to provide a first clock $X_1$ with multiple phases according to an output of the oscillator core 212. As shown in the figure, the first clock $X_1$ includes quadrature clock signals I+, Q+, and I−, where the clock signals I+ and Q+ have a 90-degree phase difference therebetween, and the clock signals I+ and I− have a 180-degree phase difference therebetween. It should be noted that the implementation of the oscillator block 202 is not limited to a combination of the oscillator core 212 and the frequency divider 214. In an alternative design, the oscillator block 202 may be implemented by the oscillator core 212 for generating the clock signal I+ with a period equal to $T_1$, and a plurality of delay cells with predetermined delay values (e.g., $$\frac{T_1}{4}$$

and $$\frac{T_1}{2})$$

applied to the clock signal I+ to thereby generate the clock signals Q+ and I−. The same objective of providing a multi-phase clock output is achieved.

The delay circuit 204 includes a first delay cell 222 and a second delay cell 224. Supposing that the period of the first clock $X_1$ is $T_1$, the first delay cell 222 is arranged to apply a delay value $$\frac{T_1}{12}$$

to the incoming clock signal Q+, and the second delay cell 224 is arranged to apply a delay value $$\frac{T_1}{6}$$

to the incoming clock signal I−. Therefore, the second clock $X_2$ includes clock signals I+, Q+', and I−' with different phases.

The output block 206 includes a multiplexer 232, a toggle circuit 234, and a controller 236. The multiplexer 232 is arranged to generate a multiplexer output MUX_OUT by multiplexing the multiple phases of the second clock $X_2$ according to a control signal SC. The controller 236 is arranged to receive the multiplexer output MUX_OUT and generate the control signal SC according to the multiplexer output MUX_OUT. For example, the controller 236 in this exemplary embodiment may be implemented by a modulo-3 counter. Therefore, due to the counter value sequence produced by the modulo-3 counter as the control signal SC, the multiplexer 232 would output the clock signals I+, Q+', and I−' as its output, cyclically. The toggle circuit 234 is arranged to receive the multiplexer output MUX_OUT and generate a third clock $X_3$ according to the multiplexer output MUX_OUT. More specifically, the third clock $X_3$ is toggled (i.e., change its output logic level from "0" to "1" or vice versa) when the toggle circuit 234 is triggered by the multiplexer output MUX_OUT. For example, the toggle circuit 234 may be implemented by a T flip-flop which is triggered by rising edges of the multiplexer output MUX_OUT.

Figure 3:
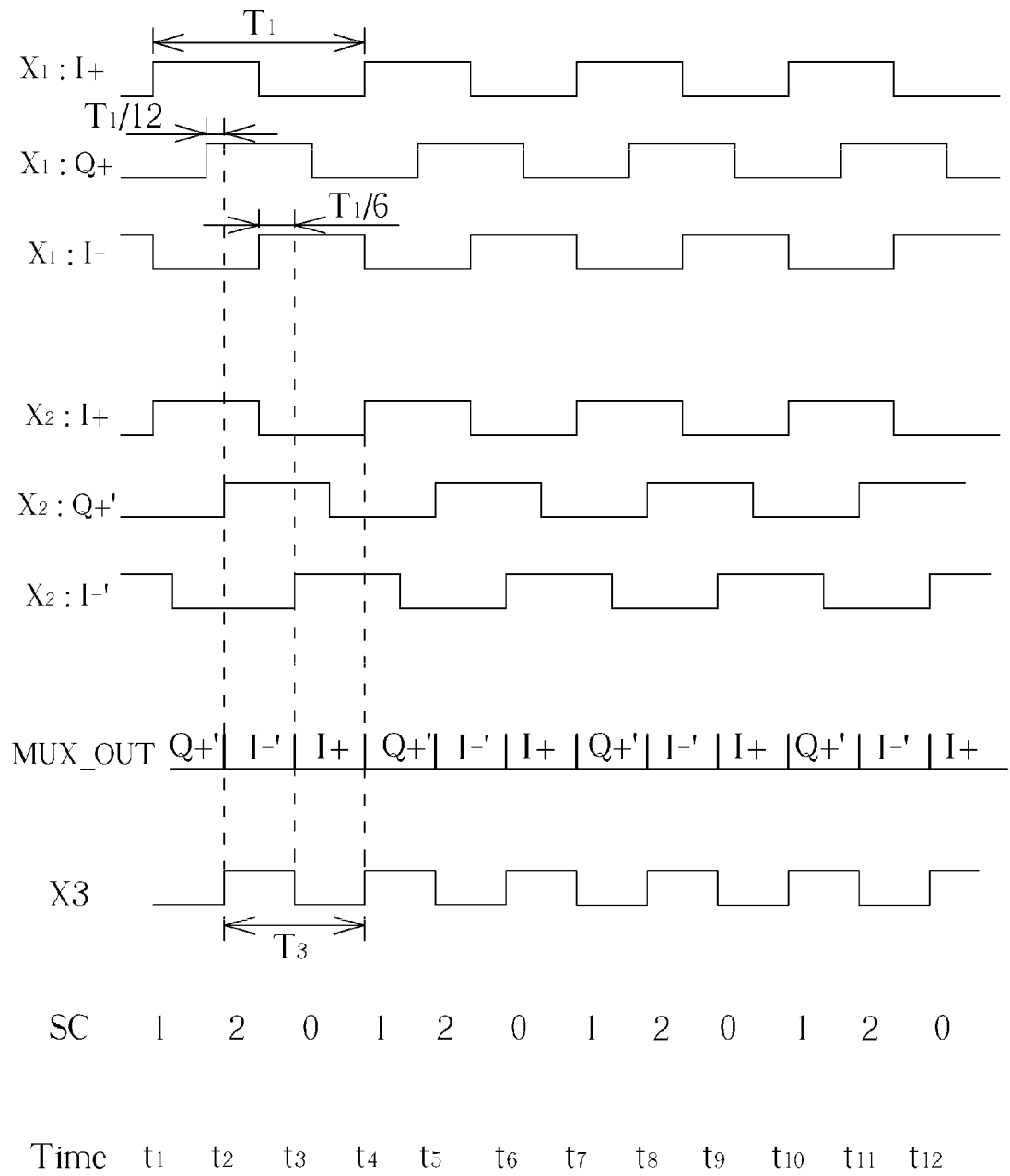
FIG. 3 is a diagram illustrating a first clock, a second clock, a multiplexer output, a third clock, and a control signal shown in FIG. 2.

Please refer to FIG. 3 in conjunction with FIG. 2. FIG. 3 is a diagram illustrating the first clock $X_1$, the second clock $X_2$, the multiplexer output MUX_OUT, the third clock $X_3$, and the control signal SC. As can be seen from FIG. 3, there is a phase difference between the clock signals Q+ and Q+' due to the intentionally applied delay value $$\frac{T_1}{12},$$

and there is a phase difference between the clock signals I− and I−' due to the intentionally applied delay value $$\frac{T_1}{6}.$$

At time $t_1$, the control signal SC is updated to a counter value "1" due to the rising edge of the clock signal I+. Therefore, the multiplexer 232 outputs the clock signal Q+' as the multiplexer output MUX_OUT. At time $t_2$, the clock signal Q+' has a rising edge which triggers both of the toggle circuit 234 and the controller 236. Therefore, the third clock $X_3$ has a transition from a low logic level "0" to a high logic level "1", and the control signal SC is updated by a counter value "2". As a result, the multiplexer 232 outputs the clock signal I−' as the multiplexer output MUX_OUT. At time $t_3$, the clock signal I−' has a rising edge which triggers both the toggle circuit 234 and the controller 236. Therefore, the third clock $X_3$ has a transition from the high logic level "1" to the low logic level "0", and the control signal SC is updated by a counter value "0". As a result, the multiplexer 232 outputs the clock signal I+ as the multiplexer output MUX_OUT. As the following operation can be easily deduced by analogy, further description is omitted here for brevity. Considering a case where the frequency of the first clock $X_1$ is 1666.7 MHz (i.e., $T_1$=600 ps), the frequency of the generated third clock $X_3$ would be 2500.0 MHz (i.e., $T_3$=400 ps). To put it another way, the delay-line based non-harmonic clock generator shown in FIG. 2 is capable of making the frequencies of the input clock (e.g., first clock $X_1$) and the output clock (e.g., third clock $X_3$) have a non-integer ratio equal to $$\frac{2}{3}.$$

As shown in FIG. 2 and FIG. 3, when switching between two clock signals fed into the multiplexer 232 occurs, a transition from one logic level to another logic level occurs due to the clock signals having different logic levels, which may result in a switching glitch in the multiplexer output MUX_OUT under certain condition. To avoid this switching glitch issue, the present invention therefore proposes a modified non-harmonic clock generator with a multiplexer which is controlled to switch from one clock signal to another clock signal when the clock signals both have the same logic level. Please refer to FIG. 4, which is a diagram illustrating a clock generator according to a second exemplary embodiment of the present invention. The implementation of the exemplary clock generator 400 is also based on the structure shown in FIG. 1, and therefore has an oscillator block 402, a delay circuit 404, and an output block 406. The oscillator block 402 is arranged to generate a first clock $X_1$ including clock signals I+ and I− that have a 180-degree phase difference therebetween. The delay circuit 404 includes a first delay unit 412 and a second delay unit 414, wherein the first delay unit 412 has delay cells 413_1 and 413_2 included therein, and the second delay unit 414 has delay cells 415_1 and 415_2 included therein. The first delay unit 412 is arranged to delay the multiple phases (e.g., differential phases) of the first clock $X_1$. In this exemplary embodiment, each of the delay cells 413_1 and 413_2 is employed to apply a delay value $T_2$ to the incoming clock signal. Accordingly, the first delay unit 412 outputs clock signals I+' and I−' to the following signal processing stage (i.e., the second delay unit 414).

The second delay unit 414 is arranged to delay at least one of the multiple delayed phases generated from the first delay unit 412. In this exemplary embodiment, each of the delay cells 415_1 and 415_2 is employed to apply a delay value $$\frac{T_1}{4}$$

to an incoming clock signal. Accordingly, the second delay unit 414 outputs a second clock $X_2$ including clock signals A, B, C, D with different phases. As can be seen from FIG. 4, the multiple phases of the second clock $X_2$ include delayed phases (e.g., clock signals B and D) generated from delay cells 415_1, 415_2 of the second delay unit 414 and delayed phases (e.g., clock signals A and C) generated from delay cells 413_1, 413_2 of the first delay unit 412.

Figure 4:
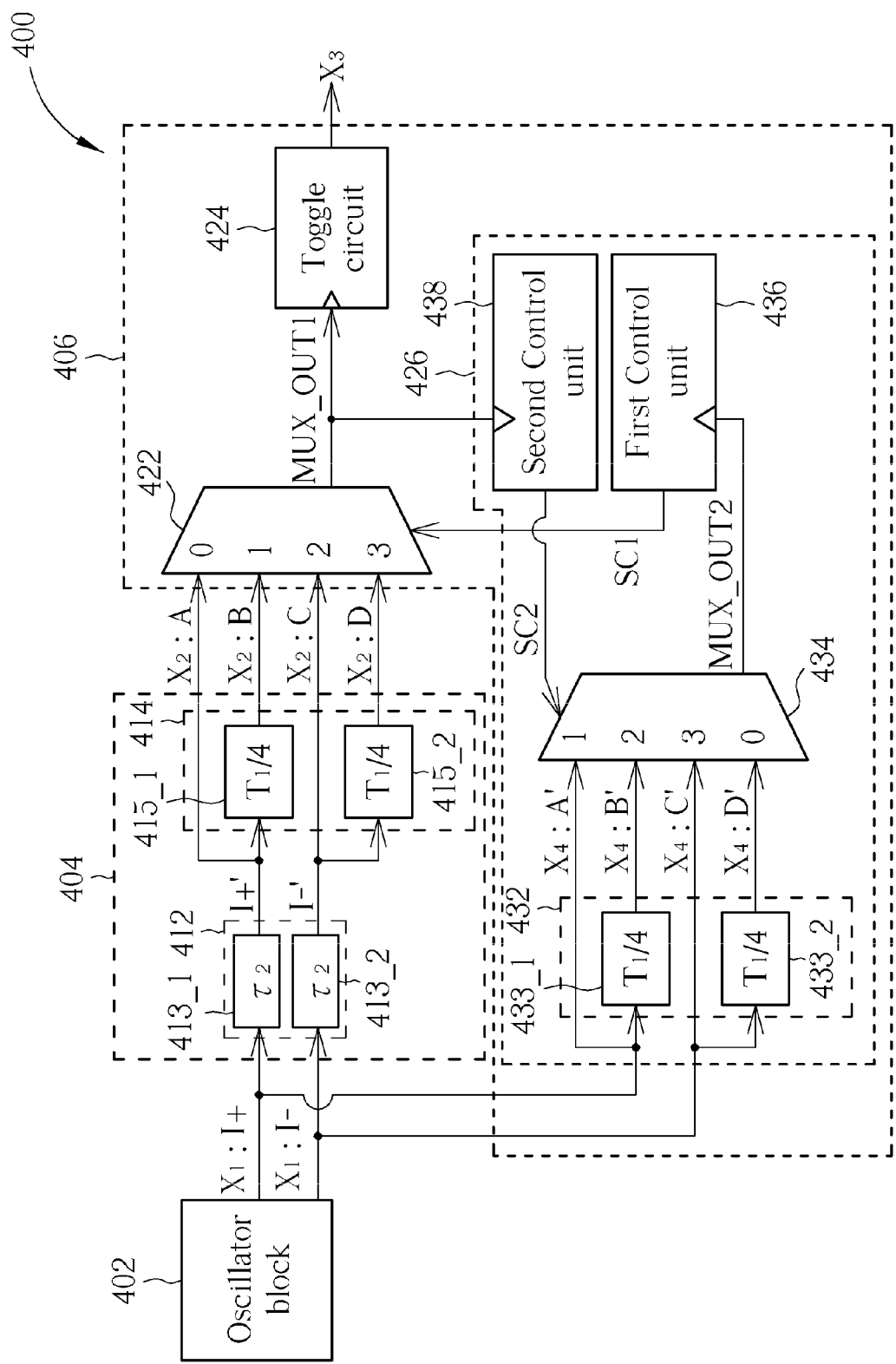
FIG. 4 is a diagram illustrating a clock generator according to a second exemplary embodiment of the present invention.

The output block 406 is arranged to control selection of the multiple phases of the second clock $X_2$ by referring to at least the multiple phases of the first clock $X_1$. As shown in FIG. 4, the output block 406 includes a first multiplexer 422, a toggle circuit 424, and a controller 426. The first multiplexer 422 is arranged to generate a first multiplexer output MUX_OUT1 by multiplexing the multiple phases of the second clock $X_2$ according to a first control signal SC1. The toggle circuit 424 is arranged to receive the first multiplexer output MUX_OUT1 and generate a third clock $X_3$ according to the first multiplexer output MUX_OUT1. More specifically, the third clock $X_3$ is toggled when the toggle circuit 424 is triggered by the first multiplexer output MUX_OUT1. For example, the toggle circuit 424 may be implemented by a T flip-flop which is triggered by rising edges of the first multiplexer output MUX_OUT1.

In this exemplary embodiment, the controller 426 is arranged to receive the first multiplexer output MUX_OUT1 and the multiple phases of the first clock $X_1$, and generate the first control signal SC1. As shown in FIG. 4, the controller 426 includes a third delay unit 432, a second multiplexer 434, a first control unit 436, and a second control unit 438. The third delay unit 432 is arranged to delay at least one of the multiple phases of the first clock $X_1$. In this exemplary embodiment, the third delay unit 432 includes delay cells 433_1 and 433_2 each applying a delay value $$\frac{T_1}{4}$$

to an incoming clock signal. Therefore, the third delay unit 432 outputs a fourth clock $X_4$ including clock signals A', B', C', D' with different phases. The second multiplexer 434 is arranged to generate a second multiplexer output MUX_OUT2 by multiplexing the multiple phases of the fourth clock $X_4$ according to a second control signal SC2, wherein the multiple phases received by the second multiplexer 434 include delayed phases (e.g., clock signals B' and D') generated from delay cells 433_1, 433_2 of the third delay unit 432 and the multiple phases (e.g., A' and C') of the first clock $X_1$.

The first control unit 436 is arranged to receive the second multiplexer output MUX_OUT2 and accordingly generate the first control signal SC1 to the first multiplexer 422. Similarly, the second control unit 438 is arranged to receive the first multiplexer output MUX_OUT1 and accordingly generate the second control signal SC2 to the second multiplexer 434. For example, the first control unit 436 and the second control unit 438 may be implemented by modulo-4 counters, which output counter values as the desired control signals.

Figure 5:
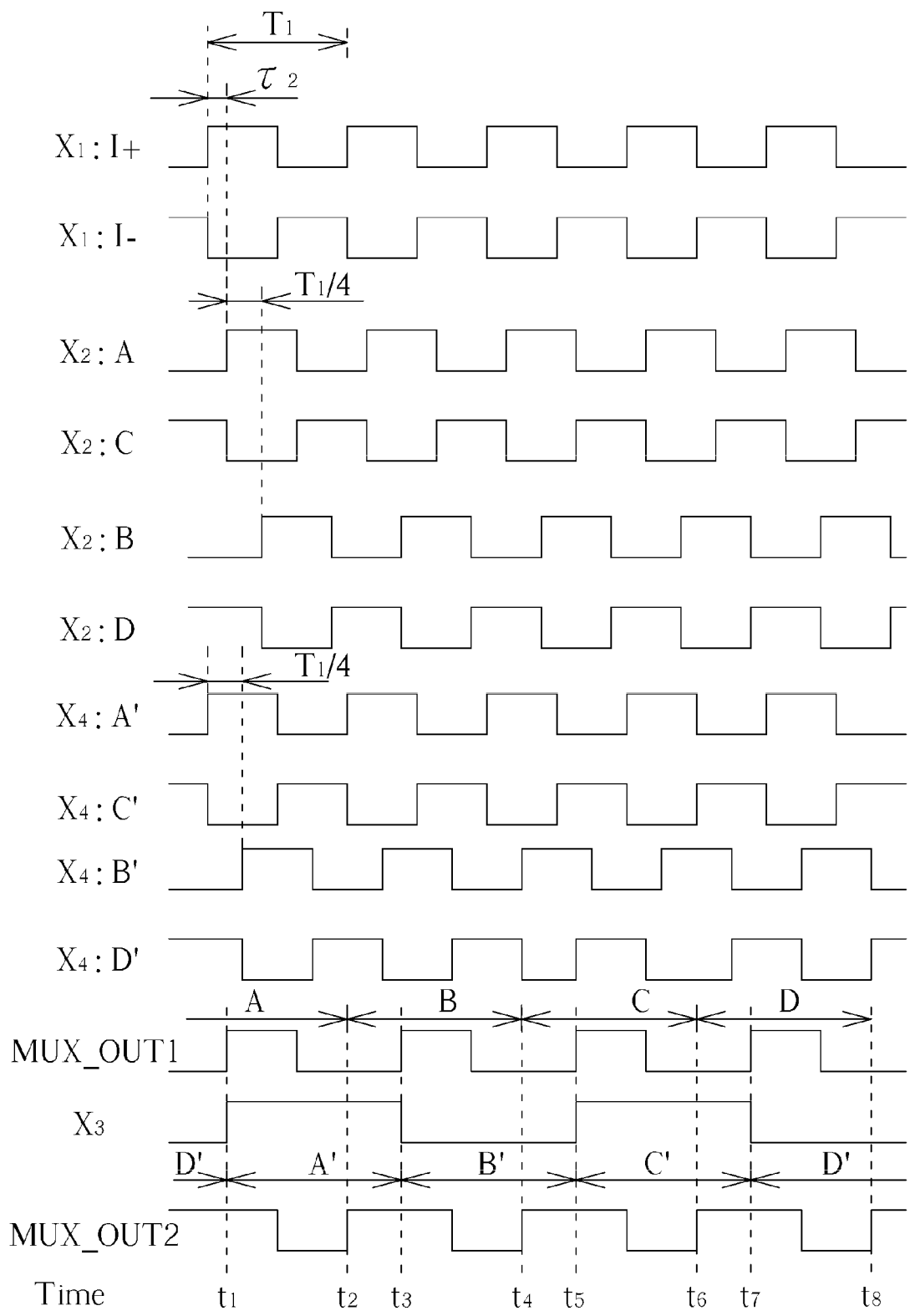
FIG. 5 is a diagram illustrating a first clock, a second clock, a fourth clock, a first multiplexer output, a third clock, and a second multiplexer output shown in FIG. 4.

Please refer to FIG. 5 in conjunction with FIG. 4. FIG. 5 is a diagram illustrating the first clock $X_1$, the second clock $X_2$, the fourth clock $X_4$, the first multiplexer output MUX_OUT1, the third clock $X_3$, and the second multiplexer output MUX_OUT2. As can be seen from FIG. 5, there is a phase difference between the clock signals I+ and A due to the intentionally applied delay value $T_2$, there is a phase difference between the clock signals I+ and B due to the intentionally applied delay value $$T_2 + \frac{T_1}{4},$$

there is a phase difference between the clock signals I− and C due to the intentionally applied delay value $T_2$, and there is a phase difference between the clock signals I− and D due to the intentionally applied delay value $$T_2 + \frac{T_1}{4}.$$

Regarding the fourth clock $X_4$, the clock signal A' is the same as the clock signal I+, and the clock signal C' is the same as the clock signal I−; however, there is a phase difference between the clock signals A' and B' due to the intentionally applied delay value $$\frac{T_1}{4},$$

and there is a phase difference between the clock signals C' and D' due to the intentionally applied delay value $$\frac{T_1}{4}.$$

Suppose that the first control signal SC1 is initialized by a counter value "0", and the second control signal SC2 is initialized by a counter value "0". Thus, before time $t_1$, the first multiplexer 422 outputs the clock signal A as the first multiplexer output MUX_OUT1, and the second multiplexer 434 outputs the clock signal D' as the second multiplexer output MUX_OUT2. At time $t_1$, the second control unit 438 and the toggle circuit 424 are both triggered by the rising edge of the clock signal A. Therefore, the third clock $X_3$ has a transition from a low logic level "0" to a high logic level "1", and the second control signal SC2 is updated by a counter value "1". Therefore, the second multiplexer 434 now outputs the clock signal A' as the second multiplexer output MUX_OUT2. Please note that both of the clock signals D' and A' have the same logic level "1" at the multiplexer switching timing (i.e., $t_1$) such that the unwanted switching glitch is avoided.

At time $t_2$, the first control unit 436 is triggered by the rising edge of the clock signal A'. Therefore, the first control signal SC1 is updated by a counter value "1", and the first multiplexer 422 now outputs the clock signal B as the first multiplexer output MUX_OUT1. Please note that both of the clock signals A and B have the same logic level "0" at the multiplexer switching timing (i.e., $t_2$) such that the unwanted switching glitch is avoided. At time $t_3$, the second control unit 438 and the toggle circuit 424 are both triggered by the rising edge of the clock signal B. Therefore, the third clock $X_3$ has a transition from the high logic level "1" to the low logic level "0", and the second control signal SC2 is updated by a counter value "2". The second multiplexer 434 now outputs the clock signal B' as the second multiplexer output MUX_OUT2. Please note that both of the clock signals A' and B' have the same logic level "1" at the multiplexer switching timing (i.e., $t_3$) such that the unwanted switching glitch is avoided. As the following operation can be easily deduced by analogy, further description is omitted here for brevity.

As can be seen from FIG. 5, the delay-line based non-harmonic clock generator shown in FIG. 4 is capable of making the frequencies of the input clock (e.g., the first clock $X_1$) and the output clock (e.g., the third clock $X_3$) to be a non-integer ratio equal to $$\frac{5}{2}.$$

It should be noted that $\tau_2 < T_1$, and the value of $\tau_2$ may comfortably separate the timing of the first and second control units 436 and 438. As the first multiplexer output MUX_OUT1 of the first multiplexer 422 is used to control the input selection of the second multiplexer 434 and the second multiplexer output MUX_OUT2 of the second multiplexer 434 is used to control the input selection of the first multiplexer 422, the switching glitch issue is solved.

The clock generator configuration shown in FIG. 4 is capable of avoiding occurrence of the switching glitch. However, this is for illustrative purposes only, and is not meant to be a limitation of the present invention. Using other clock generator configuration to solve the switching glitch issue is also feasible. Please refer to FIG. 6, which is a diagram illustrating a clock generator according to a third exemplary embodiment of the present invention. The implementation of the exemplary clock generator 600 is also based on the structure shown in FIG. 1, and therefore has an oscillator block 602, a delay circuit 604, and an output block 606. In this exemplary embodiment, the oscillator block 602 is realized by an oscillator core (e.g., a DCO) 612, a frequency divider 614, and a swapping circuit 616. The frequency divider 614, which could be realized as an edge divider, is arranged to provide a first clock $X_1$ with multiple (e.g., quadrature) phases according to an output of the oscillator core 612. As shown in the figure, the first clock $X_1$ includes clock signals I+, Q+, I−, and Q−, where the clock signals I+ and Q+ have a 90-degree phase difference therebetween, the clock signals I− and Q− have a 90-degree phase difference therebetween, the clock signals I+ and I− have a 180-degree phase difference therebetween, and the clock signals Q+ and Q− have a 180-degree phase difference therebetween.

The swapping circuit 616 is arranged to output selected phases by alternately selecting a first set of phases from the multiple phases of the first clock $X_1$ and a second set of phases from the multiple phases of the first clock $X_1$. In this exemplary embodiment, the swapping circuit 616 includes a toggle circuit 617 and a plurality of multiplexers 618 and 619. The toggle circuit 617 may be implemented by a T flip-flop, which is triggered by rising edges of the clock signal I+. Therefore, during one period of the clock signal I+, the multiplexers 618 and 619 output selected phases by selecting the clock signals I+ and Q+ as respective multiplexer outputs I and Q, and during another period of the clock signal I+, the multiplexers 618 and 619 update the selected phases by selecting the clock signals I− and Q− as respective multiplexer outputs I and Q.

Figure 6:
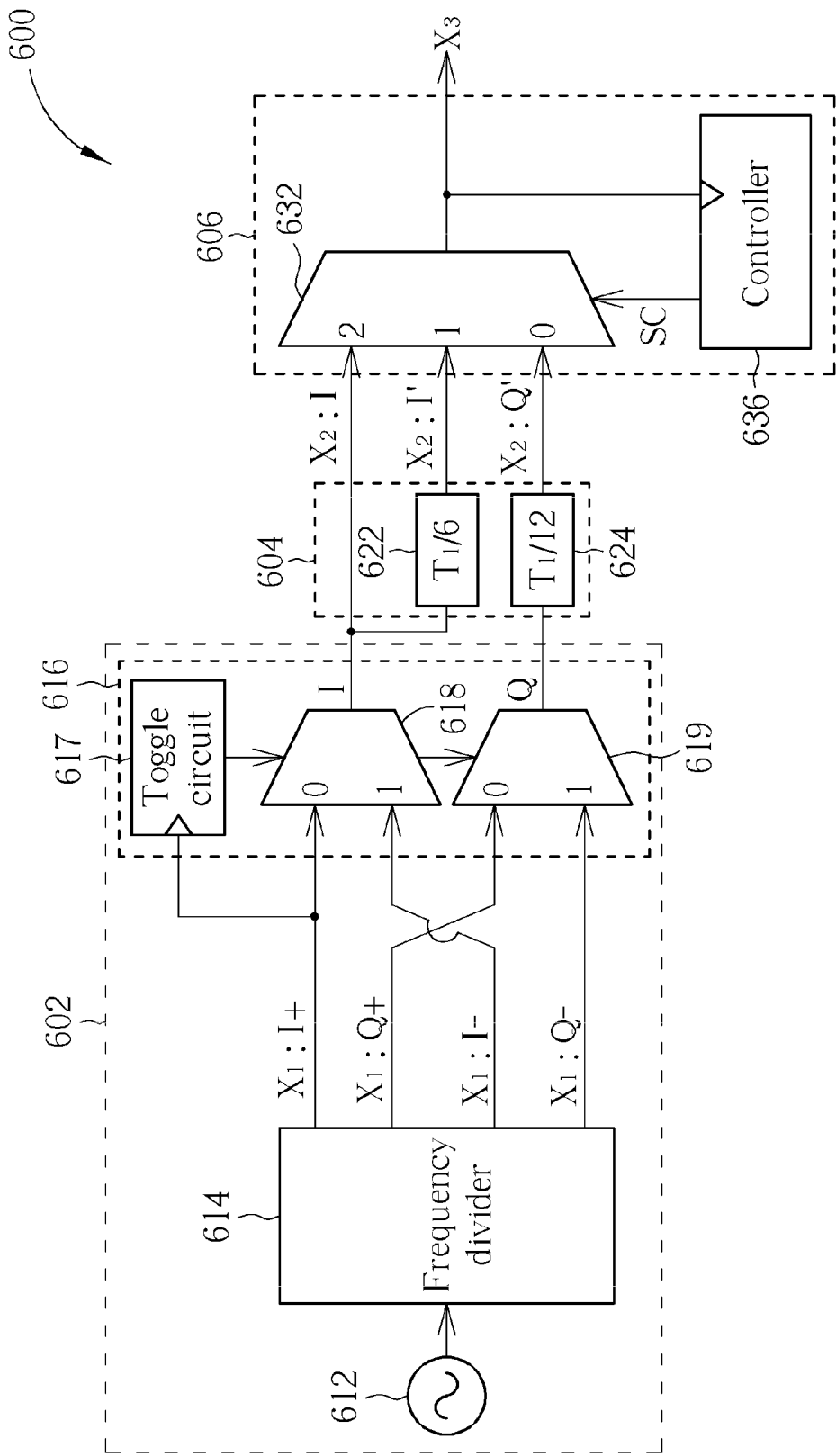
FIG. 6 is a diagram illustrating a clock generator according to a third exemplary embodiment of the present invention.

The swapping circuit 616 outputs the selected phases of the multiple phases of the first clock $X_1$ to the following delay circuit 604. In this exemplary embodiment, the delay circuit 604 includes a first delay cell 622 and a second delay cell 624. Supposing that the period of the first clock $X_1$ is $T_1$, the first delay cell 622 is arranged to apply a delay value $$\frac{T_1}{6}$$

to the incoming multiplexer output I, and the second delay cell 624 is arranged to apply a delay value $$\frac{T_1}{12}$$

to the incoming multiplexer output Q. As shown in FIG. 6, the second clock $X_2$ includes clock signals I, I', and Q' with different phases.

The output block 606 includes a multiplexer 632 and a controller 636. The multiplexer 632 is arranged to generate a third clock $X_3$ by multiplexing the multiple phases of the second clock $X_2$ according to a control signal SC. The controller 636 is arranged to receive the third clock $X_3$ and generate the control signal SC according to the third clock $X_3$. For example, the controller 636 in this exemplary embodiment may be implemented by a modulo-3 counter. Therefore, due to the counter value sequence produced from the modulo-3 counter, the multiplexer 632 would output the clock signals Q', I', and I as its output, cyclically.

Figure 7:
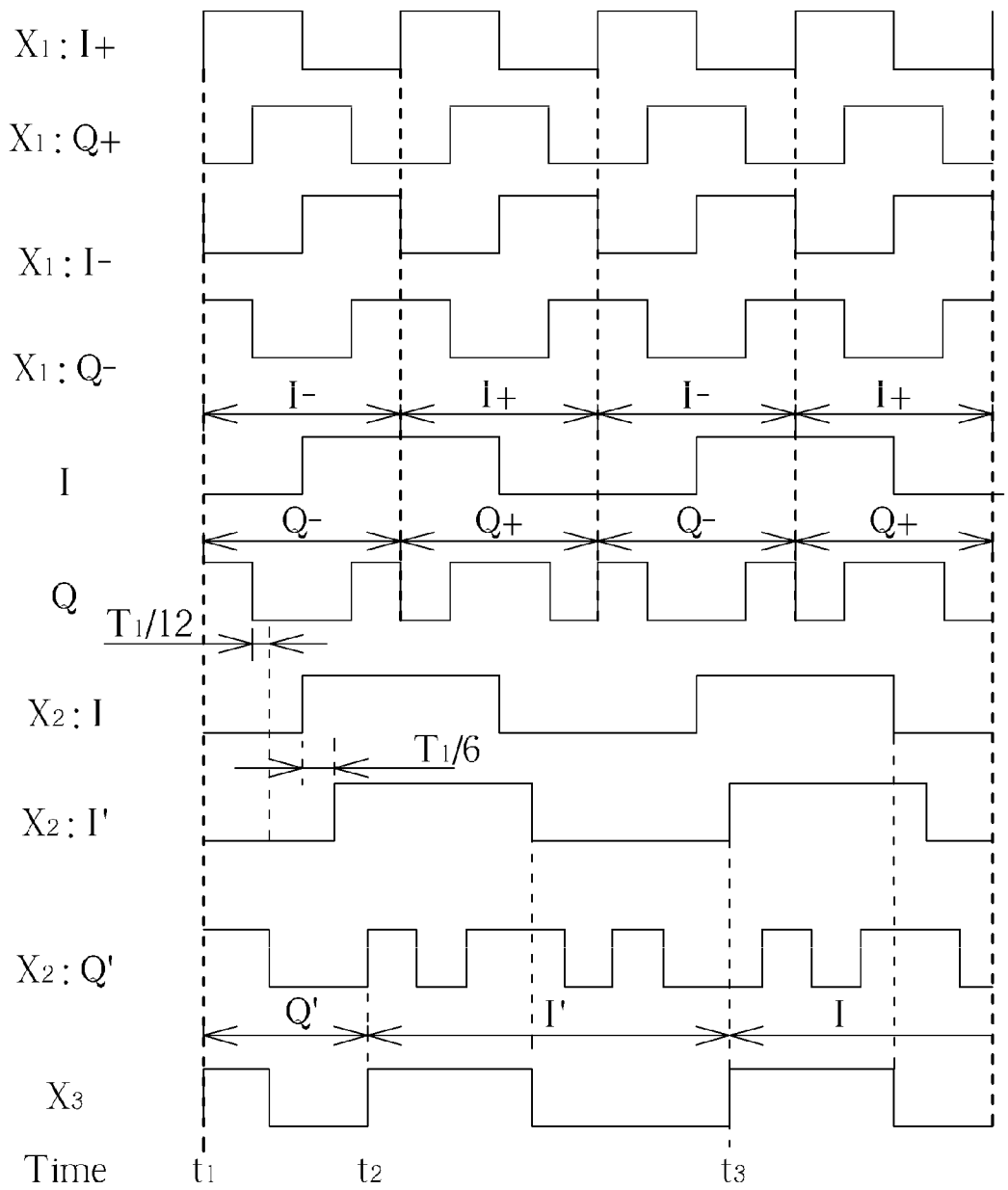
FIG. 7 is a diagram illustrating a first clock, multiplexer outputs, a second clock, and a third clock shown in FIG. 6.

Please refer to FIG. 7 in conjunction with FIG. 6. FIG. 7 is a diagram illustrating the first clock $X_1$, the multiplexer outputs I and Q, the second clock $X_2$, and the third clock $X_3$. As can be seen from FIG. 7, the multiplexer output I is set by the clock signals I− and I+, alternately; and the multiplexer output Q is set by the clock signals Q− and Q+, alternately. Besides, there is a phase difference between the clock signals Q and Q' due to the intentionally applied delay value $$\frac{T_1}{12},$$

and there is a phase difference between the clock signals I and I' due to the intentionally applied delay value $$\frac{T_1}{6}.$$

The controller bib may be a modulo-3 counter triggered by rising edges of the third clock $X_3$. Thus, the multiplexer 632 outputs the clock signals Q', I' and I, cyclically.

Initially, the multiplexers 618 and 619 output clock signals I+ and Q+, respectively; and the multiplexer 632 outputs the clock signal Q' as the third clock $X_3$ due to the control signal SC set by a counter value "0". At time $t_1$, the toggle circuit 617 is triggered by the rising edge of the clock signal I+. Therefore, the multiplexers 618 and 619 output clock signals I− and Q−, respectively. At time $t_2$, the third clock $X_3$ has a transition from the low logic level "0" to the high logic level "1", and the controller 636 is triggered by the rising edge of the clock signal Q'. Therefore, the control signal SC is updated by a counter value "1". Accordingly, the clock signal I' is selected by the multiplexer 632 to act as its output. As shown in FIG. 7, both of the clock signals Q' and I' have the same logic level "1" at the multiplexer switching timing (i.e., just after $t_2$) such that the unwanted switching glitch is avoided. At time $t_3$, the third clock $X_3$ has a transition from the low logic level "0" to the high logic level "1", and the controller 636 is triggered by the rising edge of the clock signal I'. Therefore, the control signal SC is updated by a counter value "2". Accordingly, the clock signal I is selected by the multiplexer 632 to act as its output. As shown in FIG. 7, both of the clock signals I' and I have the same logic level "1" at the multiplexer switching timing (i.e., just after $t_3$) such that the unwanted switching glitch is avoided. As the following operation can be easily deduced by analogy, further description is omitted here for brevity.

As can be seen from FIG. 7, the delay-line based non-harmonic clock generator shown in FIG. 6 is capable of making the frequencies of the input clock (e.g., the first clock $X_1$) and the output clock (e.g., the third clock $X_3$) have a non-integer ratio equal to $$\frac{2}{3}$$

which is different from that of the aforementioned clock generators 200 and 400. In other words, with a proper design of the clock generator, any non-integer ratio of input clock's frequency to output clock's frequency can be realized.

Figure 8:
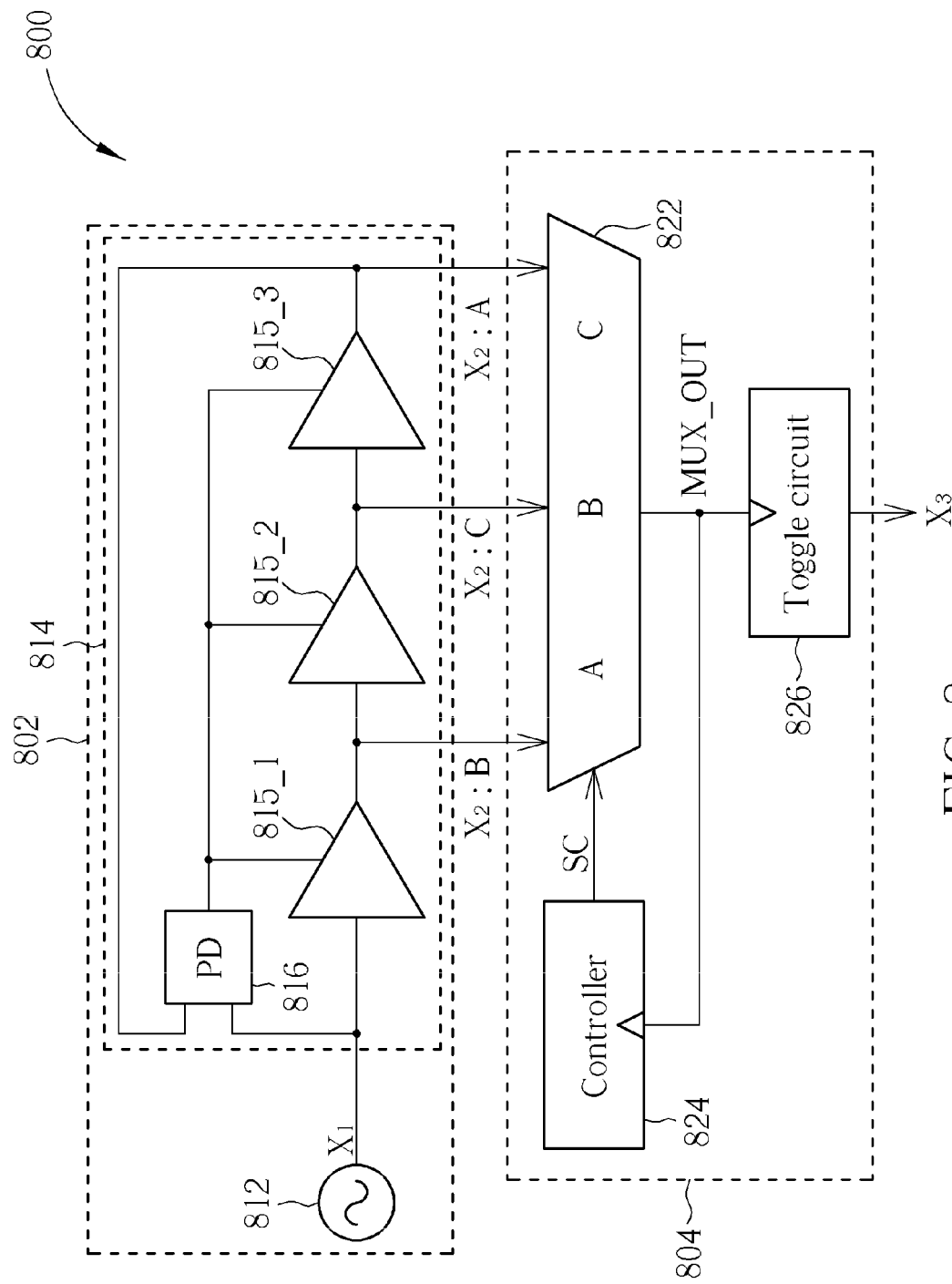
FIG. 8 is a diagram illustrating one implementation of a delay-locked loop (DLL) based non-harmonic clock generator according to an exemplary embodiment of the present invention.

In above exemplary embodiments, various designs of a delay-line based non-harmonic clock generator for generating an output clock having non-harmonic relationship with an input clock are proposed. However, this is for illustrative purposes only, and is not meant to be a limitation of the present invention. That is, using other clock generator configurations for generating an output clock having non-harmonic relationship with an input clock is feasible. Please refer to FIG. 8, which is a diagram illustrating one implementation of a delay-locked loop (DLL) based non-harmonic clock generator according to an exemplary embodiment of the present invention. The clock generator 800 includes an oscillator circuit 812, a delay circuit (e.g., a DLL 814) that uniformly interpolates between the oscillator circuit edges, and an output block 804. Note, the oscillator circuit 812 and delay circuit 814 can be conveniently arranged to form an oscillator/interpolator block 802. The oscillator/interpolator block 802 is arranged to provide a second clock $X_2$ of multiple phases. In this exemplary embodiment, the second clock $X_2$ includes clock signals A, B, and C with different phases. As shown in FIG. 8, the oscillator/interpolator block 802 includes the oscillator circuit (e.g., a DCO) 812 arranged to provide a first clock $X_1$, and the DLL 814 arranged to generate the second clock $X_2$ according to the first clock $X_1$. The DLL 814 includes a plurality of delay elements 815_1, 815_2, and 815_3, and a phase detector (PD) 816 arranged to compare the phase of one DLL output (e.g., the clock signal A) to the input clock (e.g., the first clock $X_1$) to generate an error signal which is then fed back as the control to all of the delay elements 815_1-815_3. Please note that the number of delay elements implemented in the DLL 814 is adjustable, depending upon the actual design requirement/consideration. As a person skilled in the art should readily understand details of the DLL 814, further description is omitted here for brevity.

The output block 804 is arranged to receive the second clock $X_2$ and generate a third clock $X_3$ by selecting signals from the multiple phases of the second clock $X_2$. It should be noted that the third clock $X_3$ has non-harmonic relationship with the first clock $X_1$. In this exemplary embodiment, the output block 804 includes a multiplexer 822, a controller 824, and a toggle circuit 826. The multiplexer 822 is arranged to generate a multiplexer output MUX_OUT by multiplexing the multiple phases of the second clock $X_2$ according to a control signal SC. The controller 824 is arranged to receive the multiplexer output MUX_OUT and generate the control signal SC according to the multiplexer output MUX_OUT. The toggle circuit 826 is arranged to receive the multiplexer output MUX_OUT and generate the third clock $X_3$ according to the multiplexer output MUX_OUT. More specifically, the third clock $X_3$ is toggled when the toggle circuit 826 is triggered by the multiplexer output MUX_OUT. For example, the toggle circuit 826 may be implemented by a T flip-flop which is triggered by rising edges of the multiplexer output MUX_OUT. Note that the toggle circuit can conveniently include circuitry to generate multiple phases of its output clock.

Figure 9:
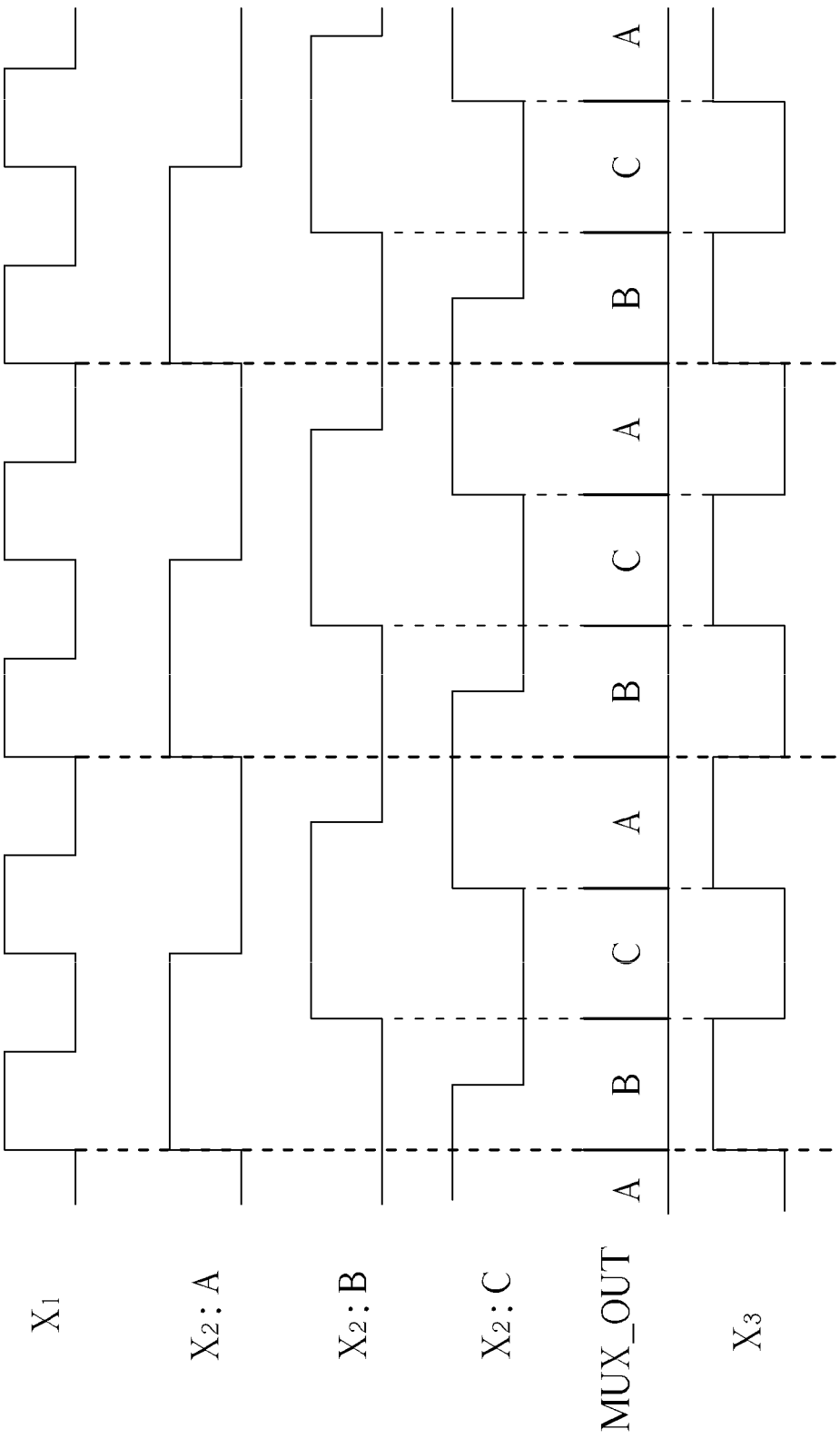
FIG. 9 is a diagram illustrating a first clock, a second clock, a multiplexer output, and a third clock shown in FIG. 8.

Please refer to FIG. 9 in conjunction with FIG. 8. FIG. 9 is a diagram illustrating the first clock $X_1$, the second clock $X_2$, the multiplexer output MUX_OUT, and the third clock $X_3$. As shown in the figure, the multiplexer output MUX_OUT is cyclically set by the clock signals A, B, and C under the control of the controller (e.g., a modulo-3 counter) 824. As a person skilled in the art can readily understand the generation of the third clock $X_3$ shown in FIG. 9 after reading above paragraphs directed to FIG. 3, further description is omitted here for brevity. Considering a case where the frequency of the first clock $X_1$ is 3.2 GHz, the frequency of the generated third clock $X_3$ would be 2.4 GHz. To put it another way, the DLL based non-harmonic clock generator shown in FIG. 8 is capable of making the frequencies of the input clock (e.g., the first clock $X_1$) and the output clock (e.g., the third clock $X_3$) have a non-integer ratio equal to $$\frac{4}{3}.$$

Figure 10:
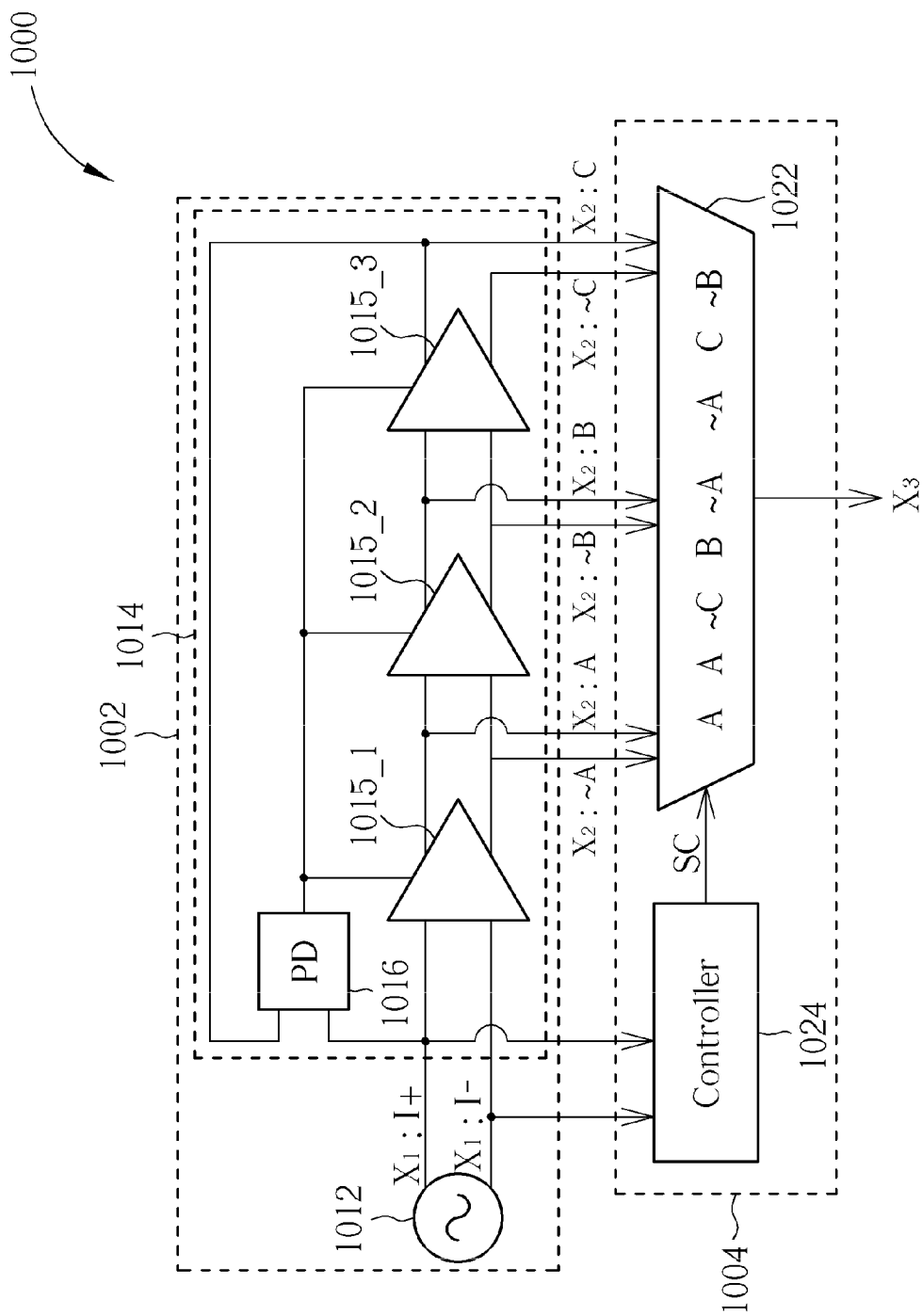
FIG. 10 is a diagram illustrating another implementation of a DLL based non-harmonic clock generator according to an exemplary embodiment of the present invention.

Please refer to FIG. 10, which is a diagram illustrating another implementation of a DLL based non-harmonic clock generator according to an exemplary embodiment of the present invention. The clock generator 1000 includes an oscillator circuit 1012, a delay circuit (e.g., a DLL 1014) that generates multiple edges through interpolation of its input clock, and an output block 1004. The oscillator block 1012 and the delay circuit (e.g., the DLL 1014) are conveniently combined into a single oscillator/interpolator block 1002. The oscillator/interpolator block 1002 is arranged to provide a second clock $X_2$ of multiple phases. In this exemplary embodiment, the second clock $X_2$ includes clock signals A, ~A, B, ~B, C, and ~C with different phases. More specifically, the clock signals A and ~A are out of phase, the clock signals B and ~B are out of phase, and the clock signals C and ~C are out of phase. As shown in the figure, the oscillator/interpolator block 1003 includes the oscillator circuit (e.g., a DCO) 1012 arranged to provide a first clock $X_1$ including clock signals I+ and I− that are out of phase (i.e., 108 degrees apart), and the DLL 1014 arranged to generate (through interpolation) the aforementioned second clock $X_2$ according to the first clock $X_1$, wherein the DLL 1014 includes a plurality of delay elements 1015_1, 1015_2, and 1015_3, and a phase detector (PD) 1016 arranged to compare the phase of one DLL output (e.g., the clock signal C) to the input clock (e.g., the clock signal I+) to generate an error signal which is then fed back as the control to all of the delay elements 1015_1-1015_3. As a person skilled in the art should readily understand details of the DLL 1014, further description is omitted here for brevity.

The output block 1004 is arranged to receive the second clock $X_2$ and generate a third clock $X_3$ by selecting signals from the multiple phases of the second clock $X_2$. It should be noted that the third clock $X_3$ has non-harmonic relationship with the first clock $X_1$. In this exemplary embodiment, the output block 1004 includes a multiplexer 1022 and a controller 1024. The multiplexer 1022 is arranged to generate the third clock $X_3$ by multiplexing the multiple phases of the second clock $X_2$ according to a control signal SC. The controller 1024 is arranged to receive the first clock $X_1$ and generate the control signal SC according to the first clock $X_1$. For example, the controller 1024 updates the control signal SC at rising edges of the clock signals I+ and I−.

Figure 11:
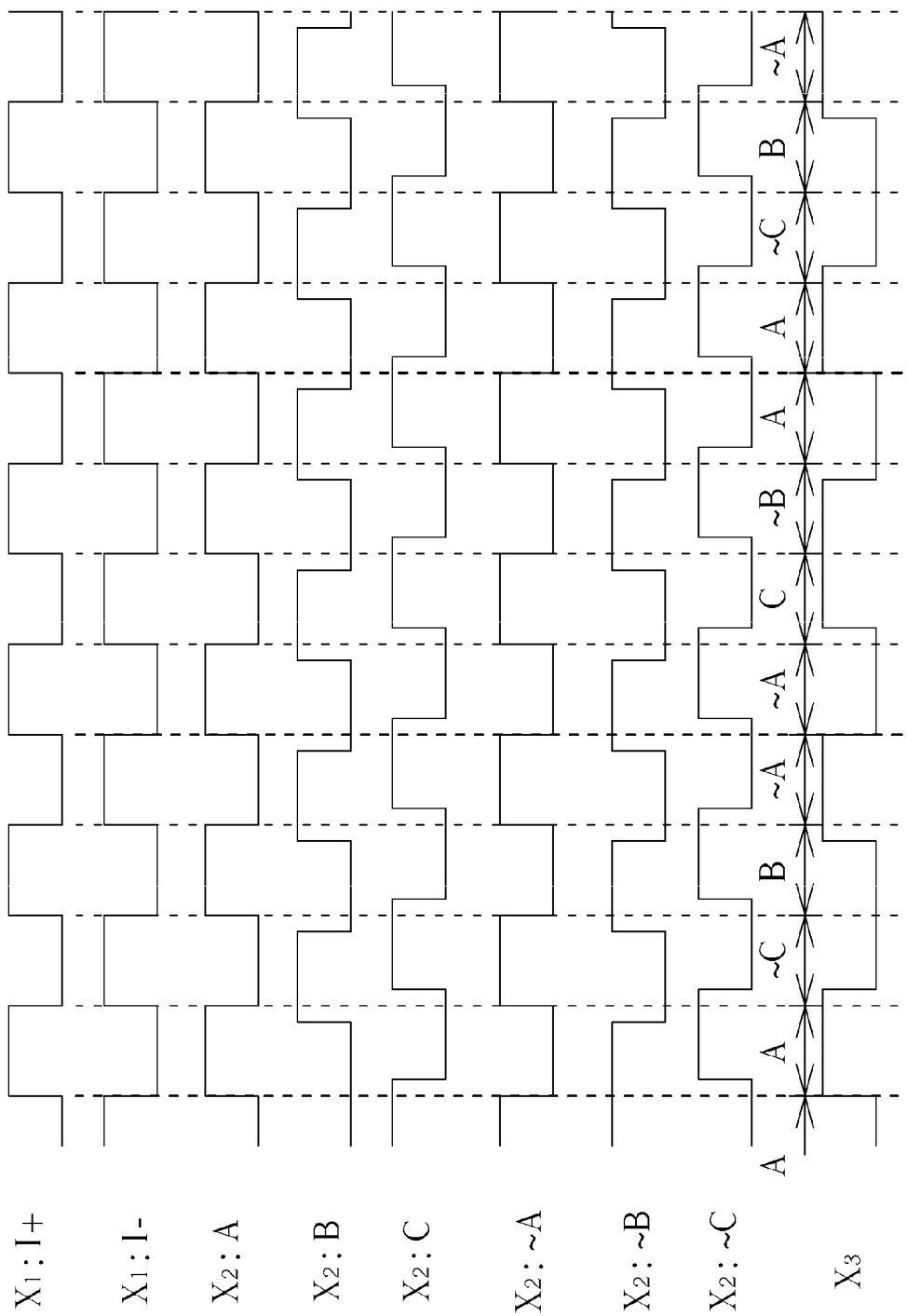
FIG. 11 is a diagram illustrating a first clock, a second clock, and a third clock shown in FIG. 10.

Please refer to FIG. 11 in conjunction with FIG. 10. FIG. 11 is a diagram illustrating the first clock $X_1$, the second clock $X_2$, and the third clock $X_3$. As shown in the figure, the multiplexer output (i.e., the third clock $X_3$) is cyclically set by the clock signals A, A, ~C, B, ~A, ~A, C, and ~B under the control of the controller 1024. As a person skilled in the art can readily understand the generation of the third clock $X_3$ shown in FIG. 11 after reading above paragraphs, further description is omitted here for brevity. Considering a case where the frequency of the first clock $X_1$ is 3.2 GHz, the frequency of the generated third clock $X_3$ would be 2.4 GHz. To put it another way, the DLL based non-harmonic clock generator shown in FIG. 8 is capable of making the frequencies of the input clock (e.g., the first clock $X_1$) and the output clock (e.g., the third clock $X_3$) have a non-integer ratio equal to $$\frac{4}{3}.$$

Figure 12:
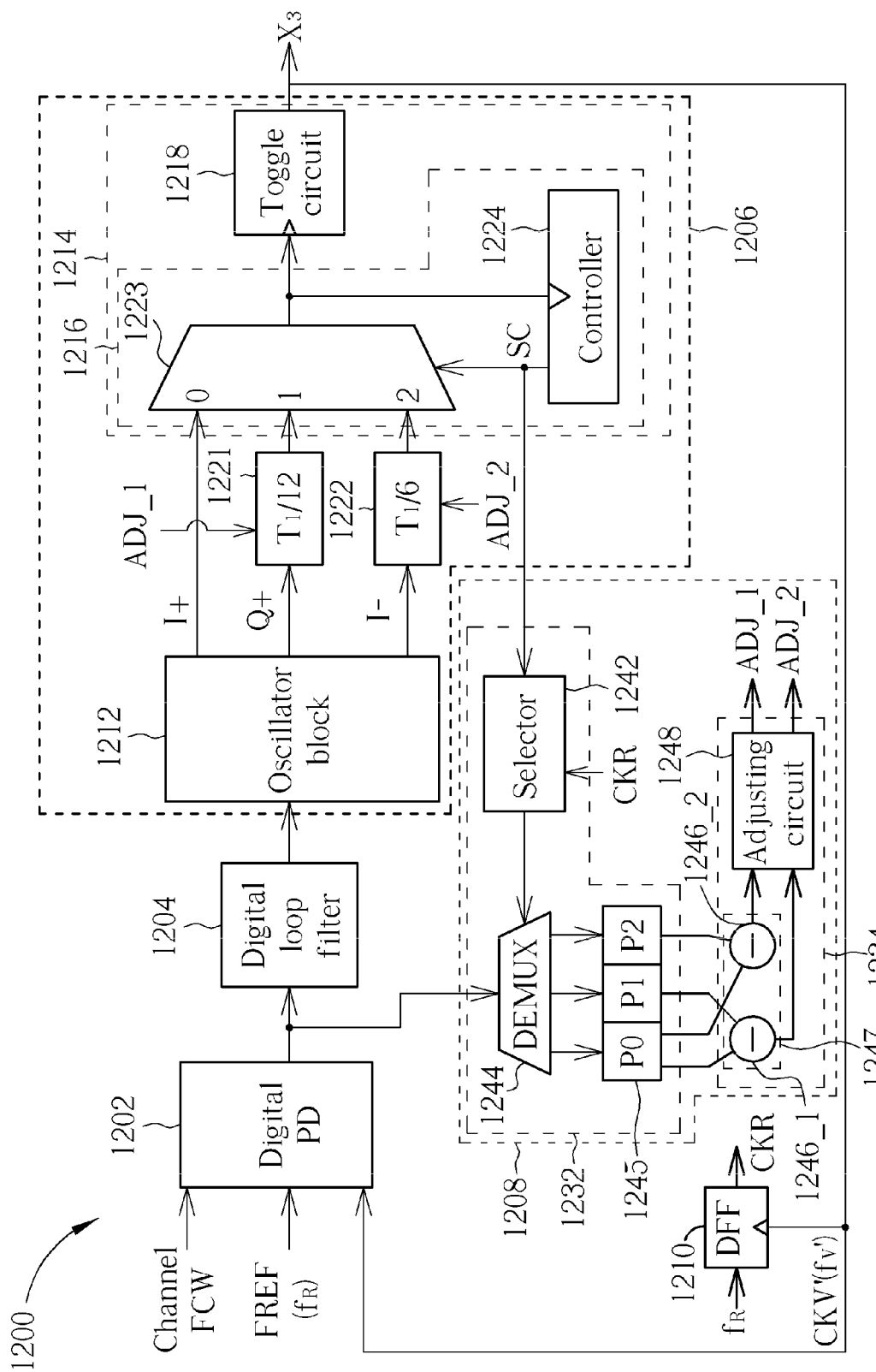
FIG. 12 is a diagram illustrating an all-digital phase-locked loop (ADPLL) employing a non-harmonic clock generator and with delay calibration according to an exemplary embodiment of the present invention.

As mentioned above, the intentionally applied delay values are used to create the desired phases/edges needed by the following output block. However, the clock signals to be multiplexed may have phase errors which would affect the actual waveform of the output clock generated from the exemplary non-harmonic clock generator proposed in the present invention. Thus, there is a need for calibrating the delay values to compensate for the delay mismatch. Please refer to FIG. 12, which is a diagram illustrating an all-digital phase-locked loop (ADPLL) employing a non-harmonic clock generator and with delay calibration according to an exemplary embodiment of the present invention. The ADPLL 1200 with delay calibration includes a digital phase detector 1202, a digital loop filter 1204, a delay-line based non-harmonic clock generator 1206, a calibration apparatus 1208, and a D flip-flop (DFF) 1210. For clarity and simplicity, only the components pertinent to the technical features of the present invention are shown in FIG. 12. That is, in another exemplary embodiment, the ADPLL 1200 may have additional components included therein. The general ADPLL architecture is well known in the art.

By way of example, but not limitation, the delay-line based non-harmonic clock generator 1206 may be implemented using the configuration shown in FIG. 2. Therefore, the delay-line based non-harmonic clock generator 1206 includes an oscillator block 1212 and an edge synthesizer 1214 having an edge rotator 1216 and a toggle circuit 1218, wherein the edge rotator 1216 includes a plurality of adjustable delay cells 1221 and 1222 controlled by calibration signals ADJ_1 and ADJ_2, a multiplexer 1223, and a controller (e.g., a modulo-3 counter) 1224. As a person skilled in the art can readily understand the operation of the delay-line based non-harmonic clock generator 1206 after reading above paragraphs directed to the clock generator 200 shown in FIG. 2, further description is omitted here for brevity.

The DFF 1210 is implemented for generating a clock signal CKR used by internal components of the ADPLL 1200 according to a frequency fR of a clock reference FREF and a frequency $f_v'$ of a feedback clock CKV'. The digital PD 1202 outputs phase error samples derived from a variable phase corresponding to an output of the edge rotator 1216 and a reference phase. For example, the reference phase is derived from the channel frequency command word (FCW) and the clock reference FREF fed into the digital PD 1202, and the variable phase is derived from the feedback clock CKV' and the clock reference FREF fed into the digital PD 1202. The digital loop filter 1204 refers to the phase error samples generated from the digital PD 1202 to generate a tuning word signal to the oscillator block 1212, which may have a DCO included therein. As a person skilled in the art should readily understand details of the digital PD 1202, the digital loop filter 1204, and the DFF 1210, further description is omitted here for brevity.

The calibration apparatus 1208 is implemented for calibrating timing mismatch of the edge rotator 1216 operating on multiple phases of an oscillator (e.g., the oscillator block 1212, which may be implemented by a combination of an oscillator core and a frequency divider or a combination of an oscillator core and delay cells). The calibration apparatus 1208 includes a capturing block 1232 and a calibrating block 1234. The capturing block 1232 is arranged to capture phase error samples generated by the digital PD 1202. The calibrating block 1234 is arranged to adjust timing of the edge rotator 1216 by generating the calibration signal $ADJ\_{1/ADJ\_2}$ to the adjustable delay cell 1221/1222 according to the phase error samples. It should be noted that the ADPLL might need to be configured to operate under restricted FCW values. More particularly, the fractional part of FCW value needs to correspond to an inverse of the period of the edge rotator. For example, the multiplexer 1223 has three inputs and its rotational period is three. Hence, the fractional value of FCW should be ⅓ or ⅔.

In this exemplary embodiment, the capturing block 1232 includes a selector 1242, a demultiplexer (DEMUX) 1244, and a storage 1245. The number of phase error samples to be captured is equal to periodicity of the edge rotator 1216. For example, the multiplexer 1223 selects a clock input with no delay value intentionally applied thereto, a clock input with a first delay value intentionally applied thereto, and a clock input with a first delay value intentionally applied thereto, cyclically. As the switching sequence of the multiplexer 1223 is known beforehand, the occurrence of the phase error samples generated from the digital PD 1202 is predictable. Based on such an observation, when the control signal SC is set by a counter value "0", the selector 1242 controls the DEMUX 1244 to store a current phase error sample P0 corresponding to the clock input with no delay value applied thereto into the storage 1245; when the control signal SC is set by a counter value "1", the selector 1242 controls the DEMUX 1244 to store a current phase error sample P1 corresponding to the clock input with the first delay value intentionally applied thereto into the storage 1245; and when the control signal SC is set by a counter value "2", the selector 1242 controls the DEMUX 1244 to store a current phase error sample P2 corresponding to the clock input with the second delay value intentionally applied thereto into the storage 1245.

Regarding the calibrating block 1234, it includes a calculating circuit 1247 and an adjusting circuit 1248. The calculating circuit 1247 is arranged to estimate the timing mismatch of the edge rotator 1216 according to the phase error samples buffered in the storage 1245, and has a plurality of subtractors 1246_1 and 1246_2 implemented for estimating phase errors. As the clock input with no delay value intentionally applied thereto may be regarded as a clock input having a correct delay value, the phase error sample P0 may serve as an ideal one. Thus, the subtractor 1246_1 calculates a difference between the phase error samples P1 and P0 to represent a phase error of the clock input with the first delay value intentionally applied thereto, and the subtractor 1246_2 calculates a difference between the phase error samples P2 and P0 to represent a phase error of the clock input with the second delay value intentionally applied thereto. To put it another way, the calculating circuit 1247 estimates the timing mismatch of the edge rotator 1216 by calculating a difference between a phase error sample (e.g., P0) of the phase error samples and each of remaining phase error samples (e.g., P1 and P2).

The adjusting circuit 1248 is arranged to adjust the timing of the edge rotator 1216 according to an output of the calculating circuit 1247. More specifically, the adjusting circuit 1248 controls the adjustable delay cells 1221 and 1222 to adjust the delay values by generating the calibrating signals ADJ_1 and ADJ_2 to the adjustable delay cells 1221 and 1222. Please note that the calibrating signal ADJ_1/ADJ_2 generated from the adjusting circuit 1248 does not change the delay value set to the adjustable delay cell 1221/1222 when the estimated phase error is zero or negligible. Moreover, the adjusting circuit 1248 may be equipped with accumulation functionality and follow a least mean square (LMS) or steepest descent algorithm, which is generally well known in the art. Thus, the estimated phase errors generated from the subtractor 1246_1 are accumulated to alleviate the noise interference, and an accumulated phase error is referenced for controlling the calibration signal ADJ_1. Similarly, the estimated phase errors generated from the subtractor 1246_2 are also accumulated to alleviate the noise interference, and an accumulated phase error is referenced for controlling the calibration signal ADJ_2. This also obeys the spirit of the present invention.

In a case where the clock signal I+ generated from the oscillator block 1212 may have no phase error presented therein, the corresponding captured phase error sample may equal zero. Therefore, the calculating circuit 1247 may be omitted, and the adjusting circuit 1248 directly refers to the phase error samples P1 and P2 to set the calibration signals ADJ_1 and ADJ_2. This alternative design also falls within the scope of the present invention.

Figure 13:
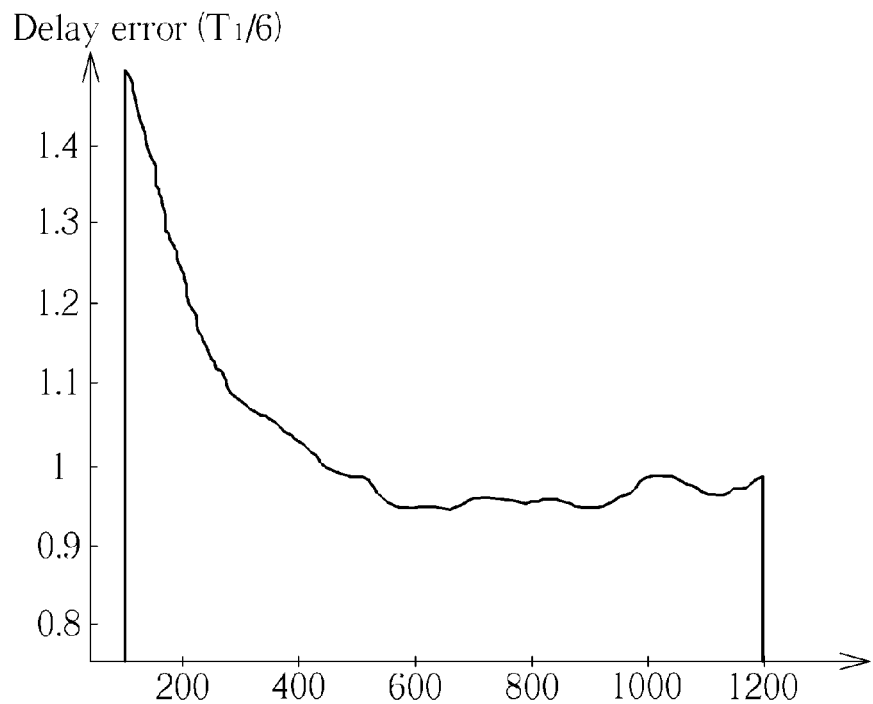
FIG. 13 is a diagram illustrating an exemplary delay calibration simulation result of a delay value set to one adjustable delay cell.
Figure 14:
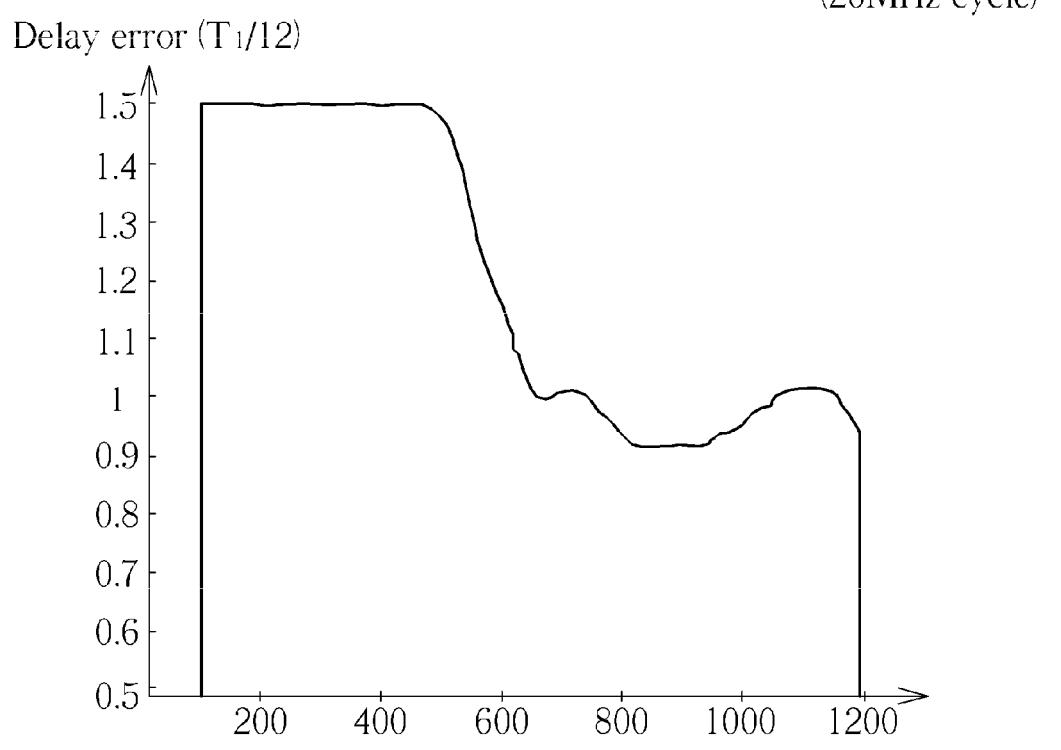
FIG. 14 is a diagram illustrating an exemplary delay calibration simulation result of a delay value set to another adjustable delay cell.

The calibrating block 1208 does not stop adjusting/calibrating the delay value(s) until the phase errors are found negligible. As the delay calibration is based on the actually captured phase error samples rather than predicted phase errors, the calibrating block 1208 therefore stochastically reduces the timing mismatch of the edge rotator 1216 through the adaptive delay mismatch calibration, as shown in FIG. 13 and FIG. 14 illustrating exemplary delay calibration simulation results of delay values respectively set to the adjustable delay cells 1222 and 1221. In the exemplary delay calibrations shown in FIG. 13 and FIG. 14, an offseted frequency is 2451*(4/3) MHz, a central frequency is 2451 MHz, and a reference clock frequency is 26 MHz. Thus, the FCW value may be set by 125.6667, where an integer part (i.e., 125) is derived from a floor value of 2451*(4/3)/26 (i.e., $\lfloor 2451*(4/3)/26 \rfloor = 125$), and a fractional part (i.e., 0.6667) is derived from $2/3$.

Please note that the proposed autonomous calibration mechanism is not limited to the ADPLL application. For example, the autonomous calibration mechanism may be implemented in any PLL application which employs the proposed clock generator (e.g., the delay-line based non-harmonic clock generator 1206) as long as the phase error information generated from the phase detector of the PLL circuit is available to the calibration apparatus.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A clock generator, comprising:
   an oscillator block, arranged to provide a second clock of multiple phases, comprising:
      an oscillator, arranged to provide a first clock; and
      a delay locked loop (DLL), arranged to generate said second clock according to said first clock; and
   an output block, arranged to receive said second clock and generate a third clock by selecting signals from said multiple phases, wherein said third clock has non-harmonic relationship with said first clock.

2. The clock generator of claim 1, wherein said output block comprises:
   a multiplexer, arranged to generate a multiplexer output by multiplexing said multiple phases according to a control signal; and
   a controller, arranged to receive said multiplexer output and generate said control signal according to said multiplexer output.

3. The clock generator of claim 2, wherein said multiplexer output is cyclically set by said signals of said multiple phases.

4. The clock generator of claim 2, wherein said controller is arranged to update said control signal when said multiplexer output has a transition from a first logic level to a second logic level.

5. The clock generator of claim 2, wherein said output block further comprises:
   a toggle circuit, arranged to receive said multiplexer output and generate said third clock according to said multiplexer output, wherein said third clock is toggled when said toggle circuit is triggered by said multiplexer output.

6. The clock generator of claim 5, wherein when said multiplexer output has a transition from a first logic level to a second logic level, said control signal is updated by said controller and said third clock signal is toggled by said toggle circuit, simultaneously.

7. The clock generator of claim 1, wherein said output block comprises:
   a multiplexer, arranged to generate said third clock by multiplexing said multiple phases according to a control signal; and
   a controller, arranged to receive said first clock and generate said control signal according to said first clock.

8. The clock generator of claim 7, wherein said first clock includes clock signals that are out of phase.

9. The clock generator of claim 8, wherein said controller is arranged to update said control signal when each of said clock signals of said first clock has a transition from a first logic level to a second logic level.

10. The clock generator of claim 7, wherein said second clock includes a plurality of clock signal pairs each having clock signals that are out of phase.

11. A clock generating method, comprising:
   providing a second clock of multiple phases, comprising:
      providing a first clock; and
      utilizing a delay locked loop (DLL) to generate said second clock according to said first clock; and
   receiving said second clock and generating a third clock by selecting signals from said multiple phases, wherein said third clock has non-harmonic relationship with said first clock.

12. The clock generating method of claim 11, wherein said step of generating said third clock comprises:
   generating a multiplexer output by multiplexing said multiple phases according to a control signal; and
   receiving said multiplexer output and generating said control signal according to said multiplexer output.

13. The clock generating method of claim 12, wherein said multiplexer output is cyclically set by said signals of said multiple phases.

14. The clock generating method of claim 12, wherein said control signal is updated when said multiplexer output has a transition from a first logic level to a second logic level.

15. The clock generating method of claim 12, wherein said step of generating said third clock comprises:

receiving said multiplexer output; and generating said third clock according to said multiplexer output, wherein said third clock is toggled when said multiplexer output has a transition from a first logic level to a second logic level.

16. The clock generating method of claim 15, wherein when said multiplexer output has said transition from said first logic level to said second logic level, said control signal is updated and said third clock signal is toggled, simultaneously.

17. The clock generating method of claim 11, wherein said step of generating said third clock comprises:

generating said third clock by multiplexing said multiple phases according to a control signal; and receiving said first clock and generating said control signal according to said first clock.

18. The clock generating method of claim 17, wherein said first clock includes clock signals that are out of phase.

19. The clock generating method of claim 18, wherein said control signal is updated when each of said clock signals of said first clock has a transition from a first logic level to a second logic level.

20. The clock generating method of claim 17, wherein said second clock includes a plurality of clock signal pairs each having clock signals that are out of phase.

* * * * *